(12) United States Patent
Cueff et al.

(10) Patent No.: US 8,692,443 B2
(45) Date of Patent: Apr. 8, 2014

(54) ELECTRICAL COMPONENT COMPRISING A MATERIAL WITH A PEROVSKITE STRUCTURE AND OPTIMIZED ELECTRODES AND FABRICATION PROCESS

(75) Inventors: Matthieu Cueff, Grenoble (FR);
Emmanuel Defay, Voreppe (FR);
Gwenael Le Rhun, Renage (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 174 days.

(21) Appl. No.: 13/481,476

(22) Filed: May 25, 2012

(65) Prior Publication Data

US 2012/0306322 A1     Dec. 6, 2012

(30) Foreign Application Priority Data

Jun. 1, 2011  (FR) ...................... 11 54813

(51) Int. Cl.
*H01L 41/047* (2006.01)

(52) U.S. Cl.
USPC ............................ 310/364; 310/358; 310/360

(58) Field of Classification Search
USPC ................. 310/358, 357, 360, 363–364, 311; 427/100, 125
IPC ................. H01L 41/04,41/047, 41/18
See application file for complete search history.

(56) References Cited

U.S. PATENT DOCUMENTS

| | | | |
|---|---|---|---|
| 6,287,637 B1 | 9/2001 | Chu et al. | |
| 6,682,772 B1 | 1/2004 | Fox et al. | |
| 7,960,901 B2 * | 6/2011 | Natori et al. | 310/358 |
| 8,164,234 B2 * | 4/2012 | Li et al. | 310/358 |
| 2004/0090500 A1 * | 5/2004 | Murai | 310/311 |
| 2009/0230821 A1 * | 9/2009 | Natori et al. | 310/358 |
| 2009/0273654 A1 | 11/2009 | Kazama et al. | |
| 2010/0141099 A1 | 6/2010 | Suenaga et al. | |
| 2011/0061215 A1 | 3/2011 | Defay et al. | |
| 2011/0080069 A1 | 4/2011 | Cueff et al. | |
| 2012/0007666 A1 | 1/2012 | David et al. | |
| 2012/0056299 A1 | 3/2012 | Defay et al. | |
| 2012/0145667 A1 | 6/2012 | Imbert et al. | |
| 2013/0106243 A1 | 5/2013 | Reinhardt et al. | |

FOREIGN PATENT DOCUMENTS

WO     2011/042388 A1     4/2011

OTHER PUBLICATIONS

Paul Muralt, "Recent Progress in Materials Issues for Piezoelectric MEMS", Journal of the American Society, 2008 pp. 1385-1396, vol. 91, No. 5, The American Ceramic Society.

(Continued)

*Primary Examiner* — Thomas Dougherty
*Assistant Examiner* — Karen B Addison
(74) *Attorney, Agent, or Firm* — Baker and Hostetler LLP

(57) ABSTRACT

An electrical component comprises a lead-based perovskite crystal material layer between a lower electrode on the surface of a substrate and an upper electrode, characterized in that the lower electrode comprises a stabilizing first layer made of a first material and a seeding second layer made of a second material, the first and second materials having the same chemical composition but different structural parameters and/or densities. A process for fabricating a component is also provided, in which the material with a perovskite structure may be PZT with a (100) or (111) orientation.

15 Claims, 6 Drawing Sheets

(56) References Cited

OTHER PUBLICATIONS

Wen Gong, et al., "Preparation of (100)- and (111)- Textured Pb(Zr,Ti)o3 Piezoelectric Films and Direct Measurement of Their Piezoelectric Constants", The Japan Society of Applied Physics, Dec. 1, 2003, pp. 1459-1461, part 2, No. 12A.

S. Trolier-Mckinstry, et al., "Thin Film Piezoelectrics for MEMS", Journal of Electroceramics, Dec. 12-17, 2004, pp. 7-17, vol. 12, Kluwer Academic Publishers, Netherlands.

P. Muralt, et al., "Texture Control of PbTiO3 and Pb(Zr,Ti)O3 Thin Films with TiO2 Seeding", Journal of Applied Physics, Apr. 1, 1998, pp. 3835-3841, vol. 83, No. 7, American Institute of Physics.

Nicolas Ledermann, et al., "{100}—Textured, Piezoelectric Pb(Zrx3,Ti1-x)O3 Thin Films for MEMS: Integration, Deposition and Properties", Sensors and Actuators A, 2003, pp. 162-170, vol. 105. Elsevier Science B.V.

C.C. Mardare, et al., "Effects of Adhesion Layer (Ti or Zr) and Pt Deposition Temperature on the Properties of PZT Thin Films Deposited by RF Magnetron Sputtering", Applied Surface Science, 2002, pp. 113-124, vol. 243, Elsevier Science S.A.

Won-Jae Lee, et al., "Pt-Base Electrodes and Effects on Phase Formations and Electrical Properties of High-Dielectric Thin Films", Thin Solid Films, 1995, pp. 75-79, vol. 269, Elsevier Science S.A.

* cited by examiner

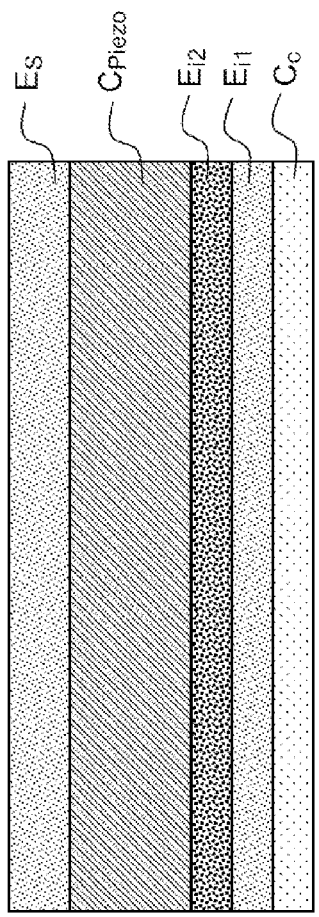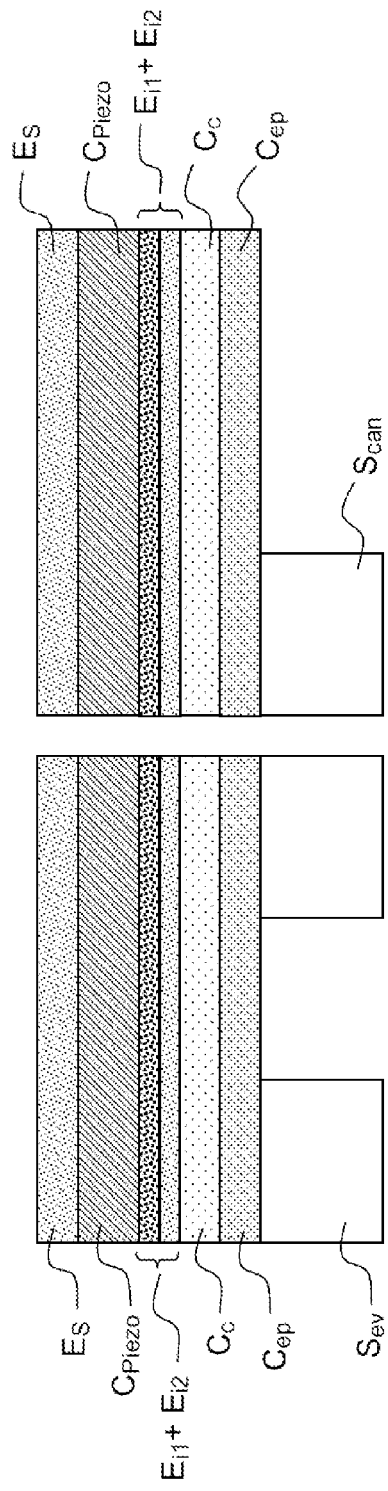
FIG.8
FIG.9a
FIG.9b

ELECTRICAL COMPONENT COMPRISING A MATERIAL WITH A PEROVSKITE STRUCTURE AND OPTIMIZED ELECTRODES AND FABRICATION PROCESS

CROSS-REFERENCE TO RELATED APPLICATION

This application claims priority to foreign French patent application No. FR 1154813, filed on Jun. 1, 2011, the disclosure of which is incorporated by reference in its entirety.

FIELD OF THE INVENTION

The field of the invention is that of electrical components based on piezoelectric and ferroelectric materials which may, advantageously, be used in actuating devices.

BACKGROUND

Many materials have piezoelectric properties. The most well known are aluminium nitride (AlN), zinc oxide (ZnO) or else lead zirconate titanate (PZT). The latter is one of a large family of materials having a particular crystal structure. This is the "perovskite" class of materials. This structure is the reason for the piezoelectric and ferroelectric properties of these "$ABO_3$"-structure-based materials. In the most commonly used materials, lead is frequently found in the A site of the lattice.

An electrical component based on a perovskite material may comprise, as schematically illustrated in FIG. 1, the following multilayer on the surface of a substrate S: a layer $C_{Piezo}$ of material lying being a lower electrode $E_i$ and an upper electrode $E_s$. To grow lead-based materials, it is known to use platinum because the latter promotes growth of the deposited material in its perovskite phase. To promote adherence of platinum to the layer beneath (generally silicon oxide), a tie layer $C_a$ may be used. The most commonly used tie layers are titanium, titanium oxide, tantalum or even strontium titanate.

An upper electrode may be deposited on the active material so as to produce a metal-insulator-metal capacitor. This electrode may be made of platinum, ruthenium, ruthenium oxide, iridium, iridium oxide, tungsten, etc.

This upper electrode may also be structured so as to form interdigitated combs in order to actuate the active material in this plane.

Two main multilayer types are used to produce components depending on the intended application.

Multilayers of the first type are called "bulk" multilayers: in these multilayers all the layers are deposited on the substrate. The substrate remains thick relative to the rest of the layers. In this way, the movement induced by the piezoelectric material is limited and coupled to that of the substrate. This type of multilayer is used when it is desired to produce components that do not have a moveable part, as illustrated in FIG. 1. A tie layer $C_a$, a lower electrode $E_i$ made of platinum, the layer $C_{Piezo}$ of lead-based perovskite active material, and an upper electrode $E_s$ are deposited in succession on the surface of a substrate S.

This type of multilayer may be used to produce tuneable capacitors or else ferroelectric memories (FeRAM). These applications make use of the ferroelectric and dielectric properties of the active material.

When it is desired for the component to have a moveable part, making use of the piezoelectric effect for example, the thickness of the component in the active zone, and more precisely the thickness of the one or more layers located under the active zone, is reduced so as to make it possible for a membrane or a cantilever, for example, to move. A diagram of such a multilayer is illustrated in FIG. 2, which shows the following multilayer on an apertured substrate $S_{ev}$: an elastic layer $C_{el}$, a tie layer $C_a$, a lower electrode $E_i$, the active layer $C_{Piezo}$ and an upper electrode $E_s$.

This type of multilayer is used to produce sensors, actuators or else resonators. This multilayer is used in "piezoelectric" applications.

Perovskite materials are complex and may present several phases with various orientations. For example, PZT may crystallize in the tetragonal, rhombohedral or monoclinic phase or in a mixture of these various phases (morphotropic composition). The piezoelectric properties of the PZT depend on its composition and its orientation. This dependence is illustrated in FIG. 3 ("Recent Progress in Materials Issues for Piezoelectric MEMS", P. Muralt, Journal of the American Society, Vol. 91, No. 5, 2008, pp. 1385-1396.).

The abscissa in FIG. 3 gives the composition, i.e. the Zr:Ti ratio of the material. The ordinate gives the value of the $e_{31,f}$ coefficient, which corresponds to the piezoelectric properties of the thin PZT films. Ti-rich PZT crystallized in the tetragonal phase and Zr-rich PZT crystallized in its rhombohedral phase. For a Zr:Ti ratio near 52:48, the PZT crystallized with a mixture of these two phases and the monoclinic phase (morphotropic phase). Maximized piezoelectric properties were obtained for compositions similar to this one. The curve $C_{3a}$ is for material textured with (111) orientation, the curve $C_{3b}$ is for material textured with (100) orientation. The piezoelectric properties are better for the (100) orientation than for the (111) orientation.

In FIG. 4 ("Preparation of (100)- and (111)-textured Pb(Zr, Ti)$O_3$ Piezoelectric Films and Direct Measurement of Their Piezoelectric Constants", W. Gong, J.-F. Li, X. Chu, Z. Gui, L. Li, Japanese Journal of Applied Physics, Vol. 42, 2003, pp. 1459-1461.), hysteresis loops of the polarization are drawn as a function of the electric field applied to the material for a given composition (MPB lithium niobate or lithium tantalate with two different orientations). The curve $C_{4a}$ is for material textured with (100) orientation and the curve $C_{4b}$ is for material textured with (111) orientation. The ferroelectric behaviour of the material thus depends on the texture of the material, the (111) orientation having a higher polarizability.

It has been demonstrated that PZT with (111) orientation is the best material for FeRAM memories because this orientation provides, for a given PZT composition, the highest remnant polarization, such as described in "High Temperature Deposition of Pt/TiO$_x$ for Bottom Electrodes", U.S. Pat. No. 6,682,772 B1, 27 Jan. 2004 and illustrated in FIG. 4.

For piezoelectric applications, the best properties are obtained for PZT with (100) orientation. This result was reported by P. Muralt et al. in "Recent Progress in Materials Issues for Piezoelectric MEMS", P. Muralt, Journal of the American Society, Vol. 91, No. 5, 2008, pp. 1385-1396 and S. Trolier-McKinstry in "Thin Film Piezoelectric for MEMS", S. Trolier-McKinstry, P. Muralt, Journal of Electroceramics, Vol. 12, 2004, pp. 7-17.

The applicant has observed that the (100) orientation has a better transverse piezoelectric coefficient $d_{31}$ relative to the (111) orientation.

To control the orientation of PZT, a germination layer may be used. It has been demonstrated by P. Muralt that a thin layer of TiO$_2$ deposited on platinum allows the (111) orientation to be obtained, as described in the article: "Texture control of PbTiO$_3$ and Pb(Zr,Ti)O$_3$ thin films with TiO$_2$ seeding", P. Muralt, T. Maeder, L. Sagalowicz, S. Hiboux, S. Scalese, D.

Naumovic, R. G. Agostino, N. Xanthopoulos, H. J. Mathieu, L. Patthey, E. L. Bullock, Journal of Applied Physics, Vol. 83, No. 7, 1998, pp. 3835-3841.

The same team also demonstrated, and described in the article "Textured, piezoelectric Pb($Zr_x$,$Ti_{1-x}$)$O_3$ thin films for MEMS: integration, deposition and properties" N. Ledermann, P. Muralt, J. Baborowski, S. Gentil, K. Mukati, M. Cantoni, A. Seifert, N. Setter, Sensors and Actuators A, Vol. 105, 2003, pp. 162-170, that a thin layer of PbO promotes the (100) orientation.

To explain these differences, lead diffusion is partially controlled by the seeding layer, the stress in the platinum and the component materials of the tie layer when the crystallization initiates. Specifically, it is known that crystallization of this type of layer depends on the interface because the crystallization mechanism is a grain-growth limited mechanism.

Another team (G. Fox, Ramtron) used a first layer with a large excess of lead (30%) and a low-temperature anneal to promote (111) growth, as described in U.S. Pat. No. 6,287,637 B1 "Multi-layer approach for optimizing ferroelectric film performance".

FIG. 5 ("Effects of adhesion layer (Ti or Zr) and Pt deposition temperature on the properties of PZT thin films deposited by RF magnetron sputtering", Mardare C. C., Joanni E., Mardare A. I., Fernandes J. R. A., de Sa C. P. M., Tavares P. B., Applied Surface Science, Vol. 243, 2005, pp. 113-124.) shows the results of a study that varied the platinum deposition temperature and the process used to carry out the PZT crystallization anneal (FIG. 5a illustrates the result obtained with a conventional oven and FIG. 5b that obtained with a rapid thermal annealer (RTA)). The crystallization of the PZT is highly dependent on these two parameters. Thus, on platinum deposited at room temperature, if the PZT is annealed in an oven, it crystallizes with (100) orientation, whereas, if it is annealed in an RTA, it crystallizes with (111) orientation. The curves in order of increasing ordinate respectively correspond to Pt deposition temperatures of 25° C., 200° C., 500° C. and 700° C.

FIG. 6 ("Pt-base electrodes and effects on phase formations and electrical properties of high-dielectric thin films", Lee W.-J., Kim Y.-M., Kim H. G., Thin Solid Films, Vol. 269, 1995, pp. 75-79.) shows the dielectric and ferroelectric properties of PZT as a function of the platinum deposition temperature. The hysteresis loops in FIG. 6a relate to permittivity whereas those in FIG. 6b relate to polarization, these improve as the platinum deposition temperature increases. It would appear then that the optimum temperature, maximizing the dielectric and ferroelectric properties of the PZT, is about 400° C.

It is also known that the deposition temperature of the platinum as the lower electrode may have an impact on the reliability of the active film.

FIG. 7a shows the dependence of PZT polarization switching fatigue on the platinum deposition temperature. The polarization fatigue is less rapid if the platinum is deposited at 500° C. compared to platinum deposited at 25° C. FIG. 7b shows the dependence of the residual strain (also called stress) in the platinum layer, before and after the PZT crystallization anneal, on the platinum deposition temperature. The higher the platinum deposition temperature, the lower the residual strain in the Pt layer will be after the PZT crystallization anneal. Finally, FIG. 7c shows the dependence of the fraction of PZT crystallized with (111) orientation on the platinum deposition temperature. The higher the platinum deposition temperature, the more PZT will be crystallized with (111) orientation. FIGS. 7a, 7b and 7c are taken from "High Temperature Deposition of Pt/$TiO_x$ for Bottom Electrodes", U.S. patent application No. 6,682,772 B1, 27 Jan. 2004.

The strain in the platinum layer acting as a lower electrode is therefore a key parameter in controlling the orientation of the PZT layer grown on top.

It is thus clear from everything that is known to those skilled in the art that the platinum deposition temperature influences the growth of lead-based perovskite layers.

The Applicant has already observed that platinum deposited at 25° C. allows (100)-oriented PZT to be obtained whereas platinum deposited at 450° C. allows (111)-oriented PZT to be obtained. This difference may be related to the diffusion of lead into the lower layers of the multilayer.

Moreover, the (100) orientation is the most favourable for actuators.

The platinum deposition temperature also influences the properties of the perovskite material. It seems that the dielectric and ferroelectric properties are poorer on platinum deposited at 25° C. than on platinum deposited at 450° C. Likewise, depositing the platinum at temperature allows the PZT polarizability fatigue to be limited.

It has been shown in the prior art that depositing platinum at 25° C. allows lead-based perovskite material with (100) orientation to be obtained. It has also been shown that depositing platinum at a low temperature leads to poorer ferroelectric and dielectric properties and to more rapid fatigue of the ferroelectric layer. More generally, it has also been shown that the strain in the platinum varies during the crystallization anneal if the latter is not annealed at the crystallization temperature of the active material. In contrast, if the PZT is deposited directly on platinum annealed at the temperature of the PZT crystallization anneal, the properties of the PZT are not as good, the optimum platinum deposition temperature being about 450° C.

The problem that the present invention seeks to solve is how to obtain the desired orientation for the material without however degrading its properties or increasing its fatigue rate.

SUMMARY OF THE INVENTION

It is for this reason, and in this context, that the Applicant has developed a new type of electrical component based on perovskite material comprising a lower electrode formed by two platinum layers, each layer ensuring a different function while being produced of one metal of identical nature, platinum for example.

More precisely, the subject of the present invention is an electrical component comprising a lead-based perovskite crystal material layer between a lower electrode on the surface of a substrate and an upper electrode, characterized in that the lower electrode comprises a stabilizing first layer made of a first material and a seeding second layer made of a second material, the first and second materials having the same chemical composition but different structural parameters and/or densities.

The expression materials of the same nature is understood to mean that the first and second materials have the same chemical composition but not the same structure. Structural parameters are for example the grain size, the surface roughness or even the texture (quality of the preferred crystal orientation) of the material. According to the invention, these parameters are greater for the first material than for the second material. The grain size and the surface roughness are greater for the first material than for the second. The density of the first and second materials depends on the deposition temperature, the first material being more dense than the second material. According to the invention, the substrate may be a homogenous or heterogeneous support.

According to one variant of the invention, the stabilizing first layer makes contact with the seeding second layer.

According to another variant of the invention, the perovskite material is one of the following materials: PZT whether doped or undoped, $PbZrO_3$, $PbTiO_3$, $Pb(Mn,Nb)O_3$ or $Pb(Mn,Nb)O_3$—$PbTiO_3$.

According to another variant of the invention, the stabilizing first layer and the seeding second layer of the lower electrode are respectively made of platinum.

According to another variant of the invention, the perovskite material is PZT with a (111) crystal orientation.

According to another variant of the invention, the perovskite material is PZT with a (100) crystal orientation.

Another subject of the invention is an actuator comprising an electrical component according to the invention, in which the substrate comprises at least one apertured part in order to define a released zone that can deform comprising the layer of perovskite material.

According to one variant of the invention, the actuator furthermore comprises an elastic layer on the surface of the substrate on which the stabilizing layer is deposited, positioned at least above the apertured part.

According to another variant of the invention, the elastic layer is made of silicon or of silicon oxide or of silicon nitride.

Yet another subject of the invention is a process for fabricating a component according to the invention, which process comprises producing, at a given crystallization temperature, a layer of perovskite material between a lower electrode and an upper electrode, said production of the lower electrode comprising the following steps: producing a stabilizing first layer by depositing platinum at a first maximum temperature T1; and producing a seeding second layer by depositing platinum at a second maximum temperature T2 that is below the first temperature T1 and the crystallization temperature of the perovskite material.

The temperatures T1 and T2 correspond to the maximum temperatures seen by the platinum during its deposition or optionally after its deposition (anneal for example) but in any case before another layer is deposited on the platinum. Moreover, the crystallization temperature used according to the process of the invention is higher than or equal to the minimum temperature (taken from graphs of values) necessary to obtain said crystallization of said material.

According to one variant of the invention, the first temperature T1 is higher than or equal to the crystallization temperature of the perovskite material. This is a preferred embodiment, although in certain cases the temperature T1 may be slightly lower than the crystallization temperature.

According to another variant, when the perovskite material is PZT with a (100) orientation, the crystallization temperature of which is higher than or equal to 500° C.; a stabilizing first layer is produced by depositing platinum at a first maximum temperature T1 of about 700° C.; and a second layer acting as a seeding layer is produced by depositing platinum at a second maximum temperature T2 that is below about 200° C. (and preferably about 25° C.).

According to another variant, when the perovskite material is PZT with a (111) orientation, the crystallization temperature of which is higher than or equal to 500° C.; a stabilizing first layer is produced by depositing platinum at a first maximum temperature T1 of about 700° C.; and a seeding second layer is produced by depositing platinum at a second maximum temperature T2 that is below about 500° C., (and preferably about 450° C.).

According to another variant, the first layer is produced at a deposition temperature and annealed at an annealing temperature, for example the deposition temperature may be 450° C., the annealing temperature possibly being 700° C.

BRIEF DESCRIPTION OF THE DRAWINGS

The invention will be better understood and other advantages will appear on reading the following non-limiting description and by virtue of the appended figures, in which:

FIG. 8 illustrates an exemplary multilayer used in an electrical component according to the invention; and FIGS. 9a and 9b illustrate two exemplary membrane and cantilever type actuators comprising a component according to the present invention.

DETAILED DESCRIPTION

Figure 1:
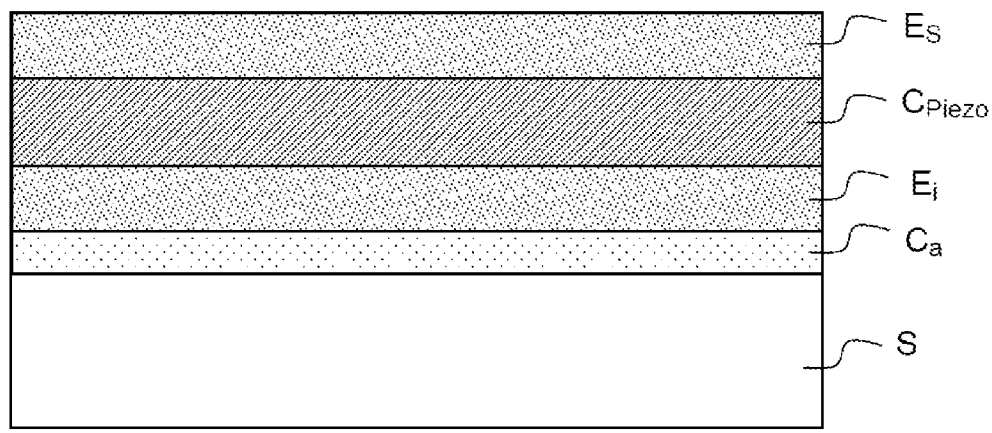
FIG. 1 illustrates a standard multilayer for a component using a lead-based perovskite layer and possibly used in a "bulk" component.
Figure 2:
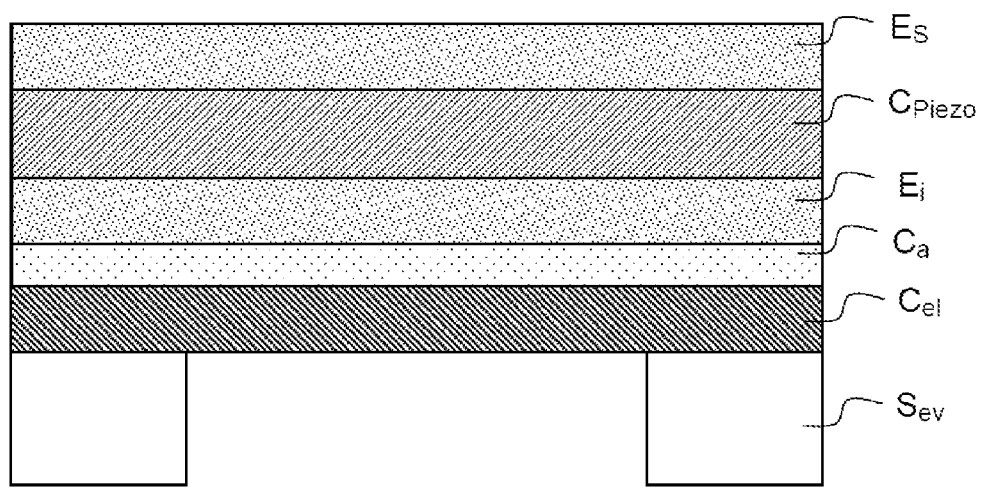
FIG. 2 illustrates a component comprising what is called a "released" substrate and the multilayer illustrated in FIG. 1.
Figure 3:
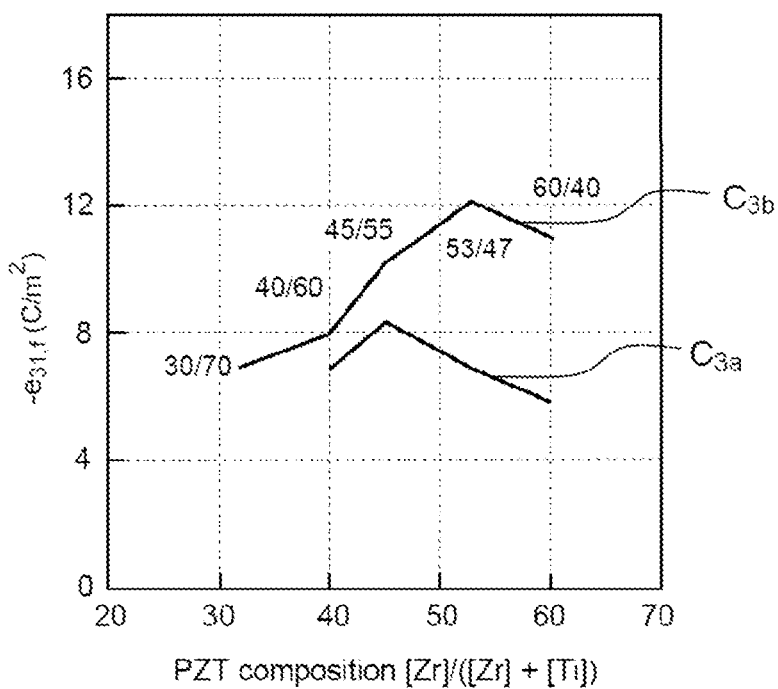
FIG. 3 illustrates the dependence of the piezoelectric properties ($e_{31}$) of PZT on its composition and its orientation.
Figure 4:
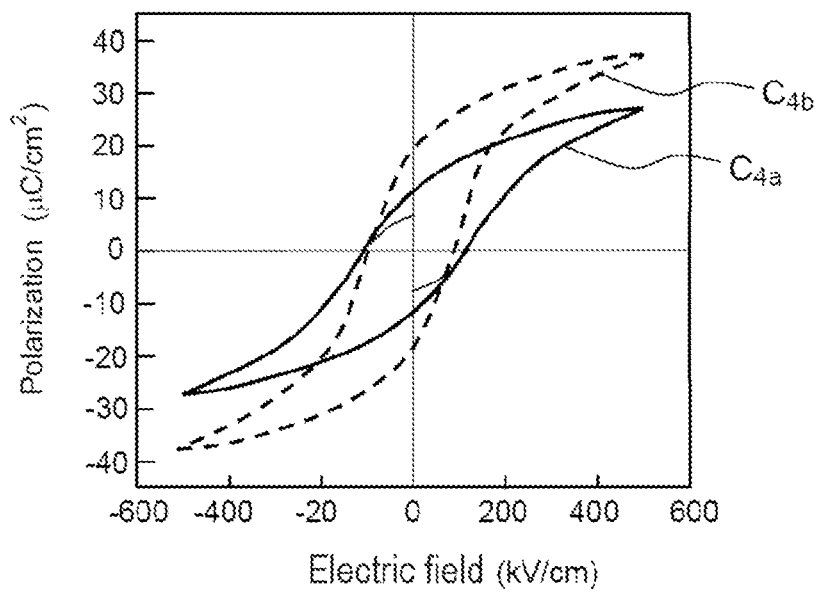
FIG. 4 illustrates the dependence of the polarization on the orientation of PZT.
Figure 5A:
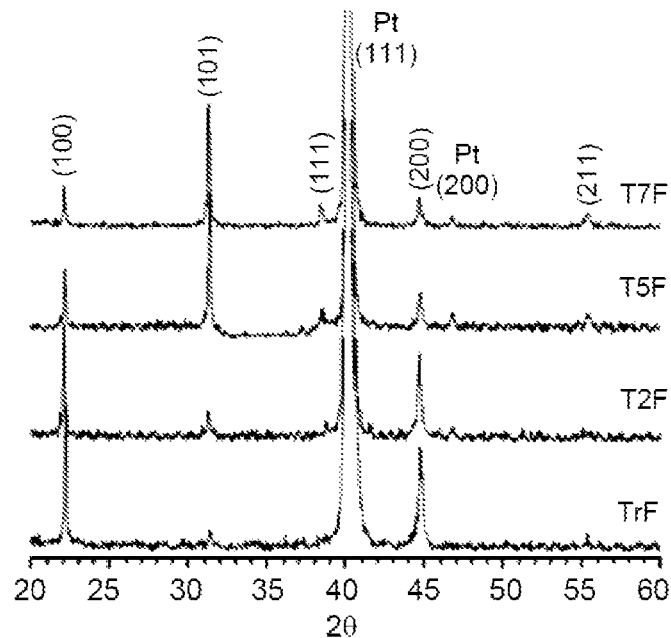
FIGS. 5a and 5b illustrate the dependence of PZT crystallization on platinum deposition temperature and on the type of crystallization anneal, in the case of a conventional annealing operation and in the case of an RTA annealing operation.
Figure 5B:
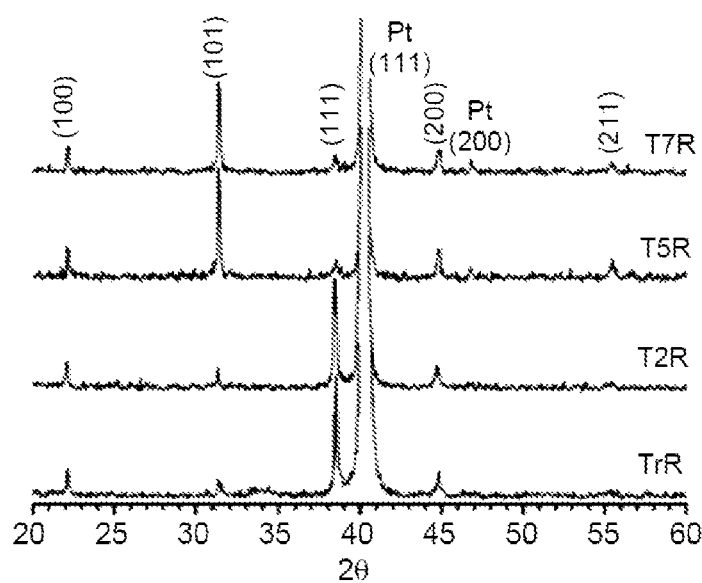
Figure 6A:
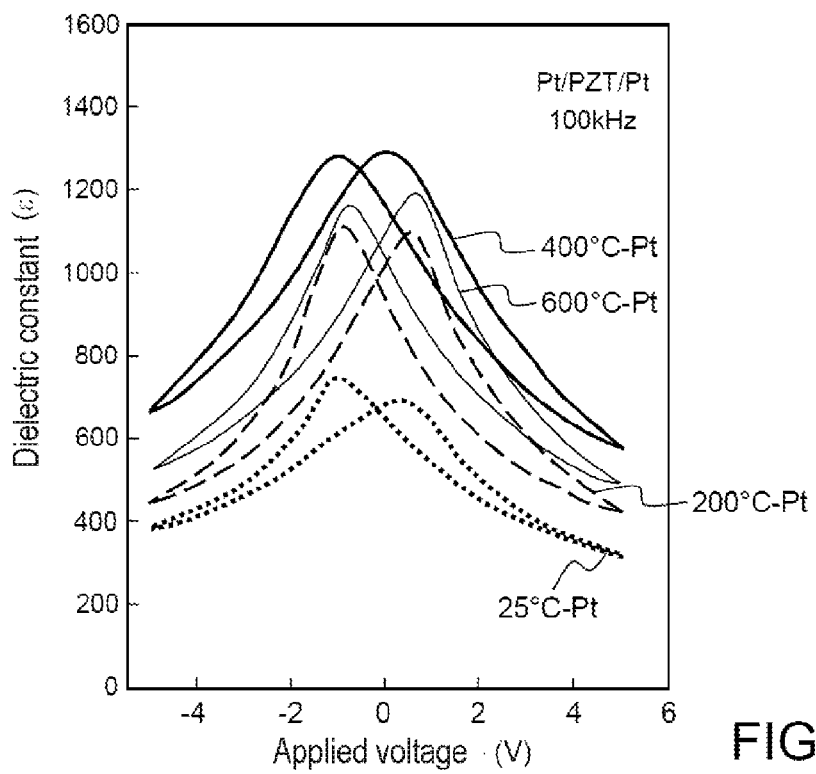
FIGS. 6a and 6b illustrate the dependence of the ferroelectric properties of PZT on platinum deposition temperature.
Figure 6B:
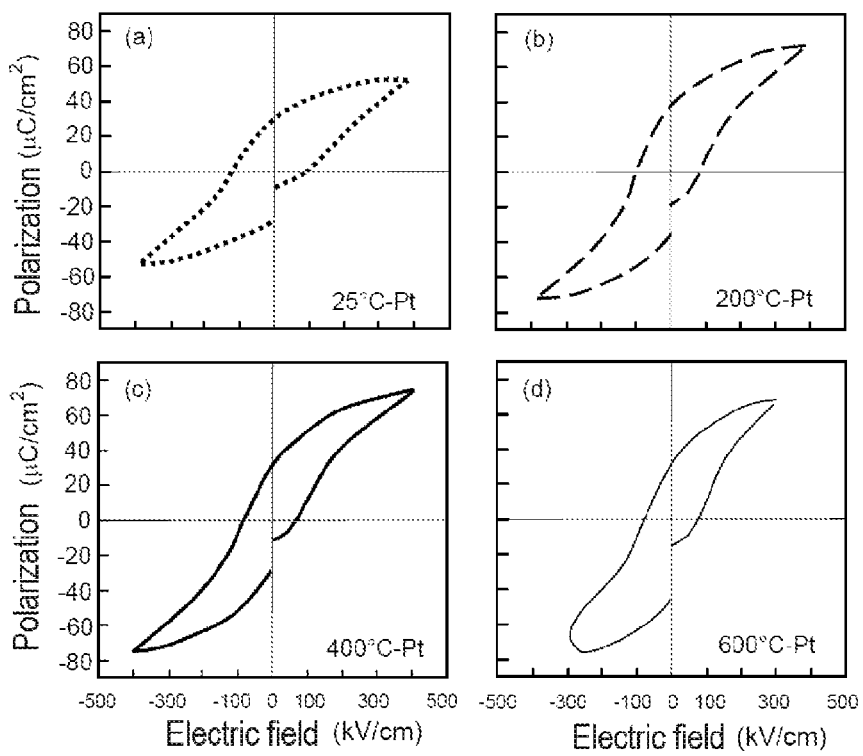
Figure 7A:
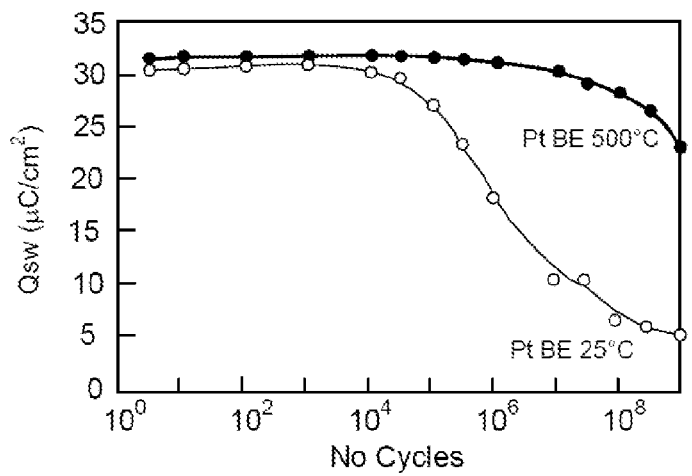
FIGS. 7a, 7b, 7c respectively illustrate the dependence of PZT polarization switching fatigue on platinum deposition temperature, the dependence of stress in the Pt layer before and after the PZT crystallization anneal on platinum deposition temperature, and the dependence of the fraction of PZT crystallized with (111) orientation on the platinum deposition temperature.
Figure 7B:
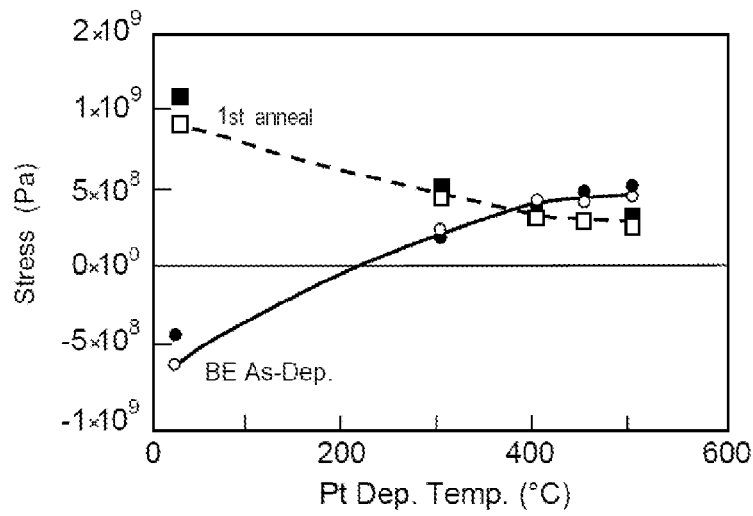
Figure 7C:
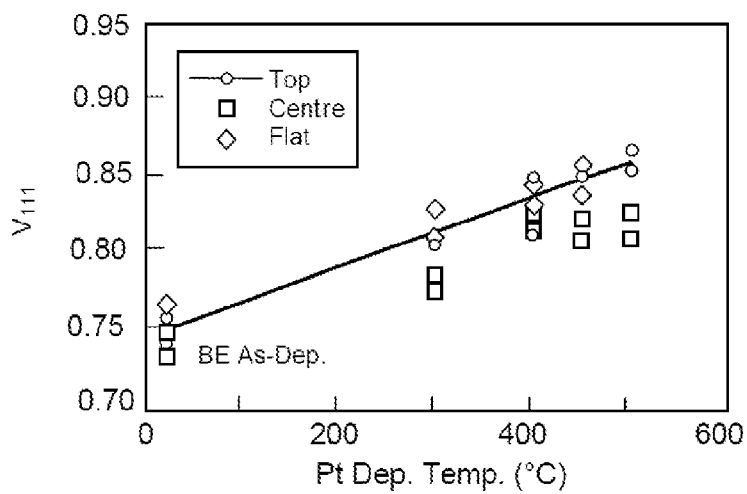

Generally, the electrical component of the present invention comprises a layer of perovskite material between a lower electrode on the surface of a substrate and an upper electrode.

The lower electrode is optimized and comprises a bilayer structure. A lower first layer called a stabilizing layer is deposited at a temperature lower than or equal to the temperature T1. When the component of the invention comprises a titanium tie layer, to prevent titanium diffusing into this first layer, the latter is deposited using two temperatures, an actual deposition temperature and an anneal temperature above the deposition temperature and equal to T1.

The maximum deposition or anneal temperature T1 is above the crystallization temperature of the perovskite material deposited in a subsequent step. Thus this temperature is chosen in order to stabilize the lower platinum layer.

In a second step, an upper second platinum layer, called a seeding layer, is deposited. Thus, a layer deposited at room temperature may be used to promote the (100) orientation or a layer deposited at 450° C. may be used to promote the (111) orientation, in the case of PZT.

FIG. 8 shows an exemplary multilayer used in an electrical component according to the invention, said multilayer comprising:

a tie layer $C_c$;

a first lower electrode $E_{i1}$ providing a stabilizing function;

a second lower electrode $E_{i2}$ providing a texturing function, also called a seeding function;

a layer $C_{Piezo}$ of perovskite material; and
an upper second electrode $E_s$.

In contrast to prior-art solutions that suggest, to promote growth of PZT with (100) and (111) orientation, using a seeding layer made of a dielectric material, for example $TiO_2$ or PbO, deposited on the platinum, the present invention uses what is called a texturing layer, also denoted a seeding layer, made of platinum.

The layer $C_{Piezo}$ of perovskite crystal PZT may then be produced in the conventional way and the upper electrode $E_s$ may then be deposited.

Exemplary Process for Fabricating Such a Structure with PZT

The two thicknesses of platinum of the lower electrode are deposited by sputtering (PVD). The first layer is deposited at 450° C. and then annealed on a hotplate at 700° C. The second layer is deposited at 25° C. The total thickness of the two layers is 100 nm, each layer having a thickness of 50 nm—nevertheless, any ratio is possible.

Next, the PZT is deposited using a sol-gel process and crystallized at 700° C. The PZT is 2 μm in thickness.

An upper electrode made of Ru is then deposited on the PZT by sputtering (PVD). The upper electrode is 100 nm in thickness.

Exemplary Production of Actuators According to the Invention

As illustrated in FIG. 9a, the actuator according to the invention comprises a membrane defined by virtue of the production of an apertured substrate $S_{ev}$, on the surface of which an elastic layer and the multilayer shown in FIG. 8 are produced.

More precisely, the actuator comprises, on the surface of the partially apertured substrate:
an elastic layer $C_{ei}$;
a tie layer $C_c$;
a first platinum layer $E_{i1}$;
a second platinum layer $E_{i2}$;
a PZT layer, $C_{Piezo}$; and
an upper electrode layer $E_s$.

Typically the tie layer may have a thickness of about 1 nm to 50 nm.

The elastic layer may be made of silicon, of silicon oxide or of silicon nitride and be about one hundred nanometers to about ten microns in thickness.

Advantageously, the layer of PZT material has the (100) orientation, the electrode stabilizing layer made of platinum is produced above 300° C., typically deposited at 450° C. then annealed at 700° C. and the seeding layer made of platinum is produced at 25° C.

These layers are respectively 50 nm in thickness.

A variant actuator according to the invention is illustrated in FIG. 9b, in which, the actuator comprises a beam on the surface of a substrate $S_{can}$, said beam being produced using the following multilayer:
an elastic layer $C_{ei}$;
a tie layer $C_c$;
a first platinum layer $E_{i1}$;
a second platinum layer $E_{i2}$;
a PZT layer, $C_{Piezo}$; and
a 100 nm-thick upper electrode layer $E_s$.

The invention claimed is:

1. An electrical component comprising a lead-based perovskite crystal material layer between a lower electrode on the surface of a substrate and an upper electrode, wherein the lower electrode comprises a stabilizing first layer made of a first material and a seeding second layer made of a second material, the first and second materials having the same chemical composition but different structural parameters and/or densities.

2. The electrical component according to claim 1, wherein the stabilizing first layer makes contact with the seeding second layer.

3. The electrical component according to claim 1, wherein the perovskite material is one of the following materials: PZT whether doped or undoped, $PbZrO_3$, $PbTiO_3$, $Pb(Mn,Nb)O_3$, or $Pb(Mn,Nb)O_3$—$PbTiO_3$.

4. The electrical component according to claim 1, wherein the stabilizing first layer and the seeding second layer of the lower electrode are respectively made of platinum.

5. The electrical component according to claim 1, wherein the perovskite material is PZT with a (111) crystal orientation.

6. The electrical component according to claim 1, wherein the perovskite material is PZT with a (100) crystal orientation.

7. An actuator comprising an electrical component according to claim 1, wherein the substrate comprises at least one apertured part in order to define a released zone that can deform comprising the layer of perovskite material.

8. The actuator according to claim 7, comprising an elastic layer on the surface of the substrate on which the stabilizing layer is deposited, positioned at least above the apertured part.

9. The actuator according to claim 8, wherein the elastic layer is made of silicon or of silicon oxide or of silicon nitride.

10. A process for fabricating a component according to claim 1, comprising producing, at a given crystallization temperature, a layer of perovskite material between a lower electrode and an upper electrode, said production of the lower electrode comprising the following steps:
producing a stabilizing first layer by depositing platinum at a first maximum temperature; and
producing a seeding second layer by depositing platinum at a second maximum temperature that is below the first temperature and the crystallization temperature of the perovskite material.

11. The process for fabricating a component according to claim 10, wherein the first temperature is higher than or equal to the crystallization temperature of the perovskite material.

12. The process for fabricating a component according to claim 10, wherein, when, the perovskite material is PZT with a (100) orientation, the crystallization temperature of which is higher than or equal to 500° C.:
a stabilizing first layer is produced by depositing platinum at a first maximum temperature of about 700° C.; and
a second layer acting as a seeding layer is produced by depositing platinum at a second maximum temperature that is below about 200° C., possibly being about 25° C.

13. The process for fabricating a component according to claim 10, wherein, when, the perovskite material is PZT with a (111) orientation, the crystallization temperature of which is higher than or equal to 500° C.:
a stabilizing first layer is produced by depositing platinum at a first maximum temperature of about 700° C.; and
a seeding second layer is produced by depositing platinum at a second maximum temperature that is below about 500° C., possibly being about 450° C.

14. The process for fabricating a component according to claim 10, wherein the first layer is produced at a deposition temperature and annealed at an annealing temperature.

15. The process for fabricating a component according to claim 14, wherein the deposition temperature is 450° C. and the annealing temperature is 700° C.

* * * * *